United States Patent

Mine

[11] Patent Number: 5,360,993
[45] Date of Patent: Nov. 1, 1994

[54] COOLING UNIT CAPABLE OF SPEEDILY COOLING AN INTEGRATED CIRCUIT CHIP

[75] Inventor: Shinji Mine, Tokyo, Japan
[73] Assignee: NEC Corporation, Tokyo, Japan
[21] Appl. No.: 963,740
[22] Filed: Oct. 20, 1992

[30] Foreign Application Priority Data

Oct. 21, 1991 [JP] Japan .................. 3-272917

[51] Int. Cl.⁵ .......................................... H01L 25/04
[52] U.S. Cl. ........................ 257/714; 257/713; 257/690; 174/15.1; 165/804; 165/104.33; 361/688; 361/712
[58] Field of Search .............. 257/714, 718, 719, 690, 257/713; 174/15.1; 165/80.4, 104.33; 361/688, 699, 712, 719

[56] References Cited

U.S. PATENT DOCUMENTS

| | | | |
|---|---|---|---|
| 3,908,188 | 9/1975 | Kawamoto | 357/82 |
| 3,993,123 | 11/1976 | Chu et al. | 257/719 |
| 4,037,270 | 7/1977 | Ahmann et al. | 361/385 |
| 4,226,281 | 10/1980 | Chu | 165/80 |
| 4,245,273 | 1/1981 | Feinberg et al. | 361/382 |
| 4,381,032 | 4/1983 | Cutchaw | 165/46 |
| 4,493,010 | 1/1985 | Morrison et al. | 361/385 |
| 4,628,990 | 12/1986 | Hagihara et al. | 257/719 |
| 4,638,404 | 1/1987 | Grossman et al. | 361/388 |
| 4,644,385 | 2/1987 | Nakanishi et al. | 357/82 |
| 4,685,211 | 8/1987 | Hagihara et al. | 29/832 |
| 4,686,606 | 8/1987 | Yamada et al. | 361/385 |
| 4,712,158 | 12/1987 | Kikuchi et al. | 361/385 |
| 4,724,611 | 2/1988 | Hagihara | 29/840 |
| 4,748,495 | 5/1988 | Kucharek | 257/719 |
| 4,783,721 | 11/1988 | Yamamoto et al. | 361/382 |
| 4,870,477 | 9/1989 | Nakanishi et al. | 257/714 |
| 4,884,167 | 11/1989 | Mine | 361/382 |
| 4,942,497 | 7/1990 | Mine et al. | 361/385 |
| 5,023,695 | 6/1991 | Umezawa et al. | 257/718 |
| 5,040,051 | 8/1991 | Thiel | 257/714 |
| 5,050,036 | 9/1991 | Oudick et al. | 257/714 |
| 5,050,037 | 9/1991 | Yamamoto et al. | 257/719 |
| 5,105,429 | 4/1992 | Mundinger et al. | 257/714 |
| 5,132,777 | 7/1992 | Klovcek | 257/714 |
| 5,161,090 | 11/1992 | Crawford et al. | 257/714 |
| 5,260,850 | 11/1993 | Sherwood et al. | 257/714 |

FOREIGN PATENT DOCUMENTS

| | | |
|---|---|---|
| 2569306 | 2/1986 | France . |
| 3835767 | 5/1989 | Germany . |
| 61-276242 | 12/1986 | Japan . |

Primary Examiner—William Mintel
Assistant Examiner—David Ostrowski
Attorney, Agent, or Firm—Burns, Doane, Swecker & Mathis

[57] ABSTRACT

In a cooling unit for use in combination with a cooling medium supplying unit (37) and for cooling at least one integrated circuit chip (31), a heat transfer tube (47) passes a cooling medium and is supported by a hat (21) with a gap left between the tube and the chip. The tube may be electrically conductive and put in contact with an electric conductor bump attached on the chip. The cooling medium supplying unit may comprise a cooling plate (39) having first and second paths (101, 105) for passing the cooling medium. The cooling unit may comprise first and second heat transfer tubes associated with the first and the second paths. Each of the first and the second tubes is supported with the gap left between each of the first and the second tubes and each of first and second chips. The first and the second tubes may be electrically conductive and put in contact with the bumps. The first chip may have primary first and second bumps. The second chip may have secondary first and second bumps. The first tube may be put in contact with the primary and the secondary first bumps. The second tube may be put in contact with the primary and the secondary second bumps.

2 Claims, 7 Drawing Sheets

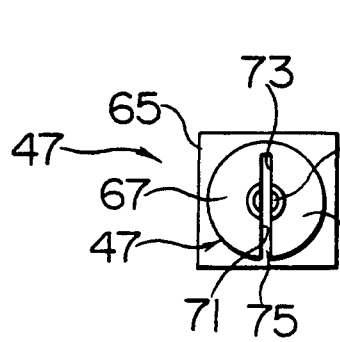
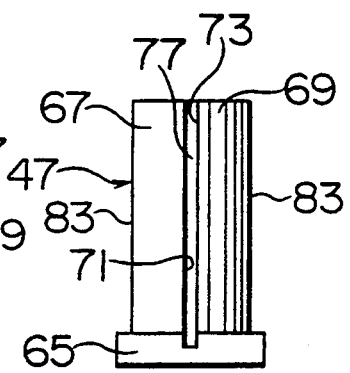
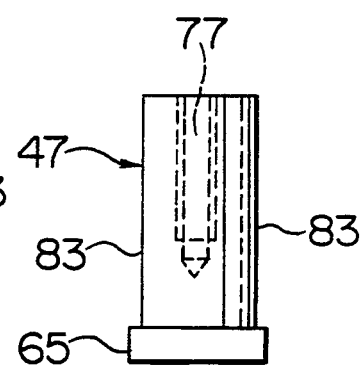
FIG. 5          FIG. 6          FIG. 7
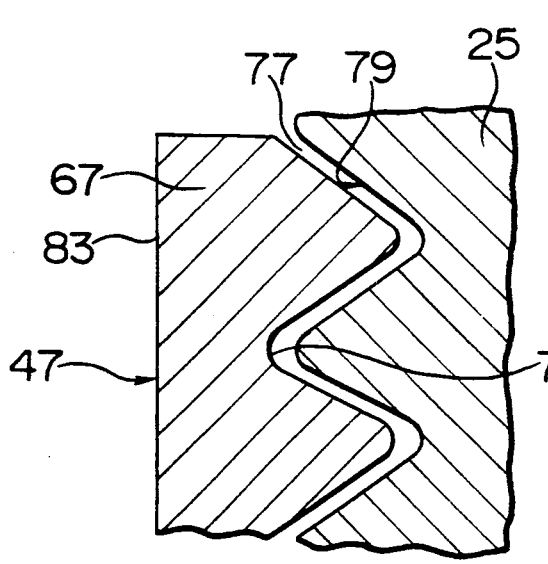
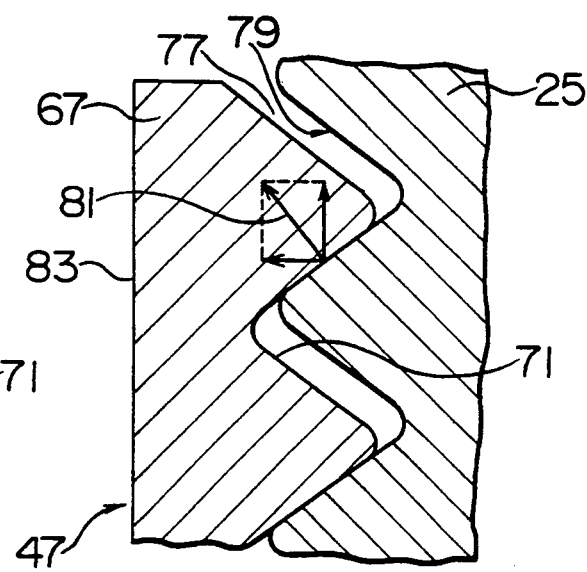
FIG. 8          FIG. 9

COOLING UNIT CAPABLE OF SPEEDILY COOLING AN INTEGRATED CIRCUIT CHIP

BACKGROUND OF THE INVENTION

This invention relates to a cooling unit for an integrated circuit chip mounted on a substrate. The cooling unit is for use in combination with a cooling medium supplying unit.

The cooling unit of the type described disclosed in U.S. Pat. No. 4,685,211 issued to Takashi Hagihara et al and assigned to NEC Corporation. This conventional cooling unit comprises a hat, plurality of pistons attached to the hat, screws for fixing the pistons to the hat with a gap left between each of the pistons and each of integrated circuit chips mounted on a substrate. The Conventional cooling unit for use in combination with a cooling medium supplying unit. The cooling medium supplying unit comprises a cooling plate attached to the hat, which has a main path having a main inlet and a main outlet. The main path is for passing the cooling medium. As will later be described more in detail, the conventional cooling unit is incapable of speedily cooling the integrated circuit chips. In addition, the conventional cooling unit is not suitable for providing large power supply to the integrated circuit chips.

SUMMARY OF THE INVENTION

It is therefore an object of this invention to provide a cooling unit which can speedily cool integrated circuit chips.

It is another object of this invention to provide a cooling unit which is of the type described and which ms suitable for providing large power supply to the integrated circuit chips.

Other objects of this invention will become clear as the description proceeds.

According to an aspect of this invention, there is provided a cooling unit for use in combination with a cooling medium supplying unit for supplying a cooling medium to the cooling unit. The cooling unit is for use in at least one integrated circuit chip mounted on a substrate, the cooling unit comprising a heat transfer tube having a tube inlet and a tube outlet for passing the cooling medium from the tube inlet to the tube outlet, and tube supporting means for supporting the heat transfer tube with a gap left between the heat transfer tube and the integrated circuit chip.

According to another aspect of this invention, there is provided a cooling unit for use in combination with a cooling medium supplying unit for supplying a cooling medium to the cooling unit, the cooling medium supplying unit comprising a cooling plate having a first main wall surface which defines a first main path having a main inlet and a first and a second inlet perforation and a second main wall surface which defines a second main path having a main outlet and a first and a second outlet perforation, the first and the second main paths being for passing the cooling medium, the cooling unit being for use in a first and a second integrated circuit chip mounted on a substrate, the cooling unit comprising (A) a first heat transfer tube having a first tube inlet associated with the first inlet perforation through a first inlet hose and a first tube outlet associated with the first outlet perforation through a first outlet hose, the first heat transfer tube being for passing the cooling medium, (B) a second heat transfer tube having a second tube inlet associated with the second inlet perforation through a second inlet hose and a tube outlet associated with the second outlet perforation through a second outlet hose, the second heat transfer tube being for passing the cooling medium, and (C) tube supporting means for supporting the first heat transfer tube with a first gap left between the first heat transfer tube and the first integrated circuit chip and the second heat transfer tube with a second gap left between the second heat transfer tube and the second integrated circuit chip.

According to still another aspect of this invention, there is provided a cooling unit for use in combination with a cooling medium supplying unit for supplying a cooling medium to the cooling unit, the cooling medium supplying unit comprising a cooling plate having a first main wall surface which defines a first main path having a main inlet and a first and a second inlet perforation and a second main wall surface which defines a second main path having a main outlet and a first and a second outlet perforation, the first and the second main paths being for passing the cooling medium, the cooling unit being for use in a first and a second integrated circuit chip mounted on a substrate, the first integrated circuit chip having a first principal surface on which a primary first and a primary second electric conductor bump is attached, the second integrated circuit chip having a second principal surface on which a secondary first and a secondary second electric conductor bump is attached, the cooling unit comprising (A) a first heat transfer tube having a first tube inlet associated with the first inlet perforation through a first inlet hose and a first tube outlet associated with the first outlet perforation through a first outlet hose, the first transfer tube being electrically conductive and being for passing the cooling medium, (B) a second heat transfer tube having a second tube inlet associated with the second inlet perforation through a second inlet hose and a second tube outlet associated with the second outlet perforation through a second outlet hose, the second heat transfer tube being electrically conductive and being for passing the cooling medium, and (C) tube supporting means for supporting the first transfer tube put in contact with the primary first electric conductor bump and the secondary first electric conductor bump and the second transfer tube put in contact with the primary second electric conductor bump and the secondary second electric conductor bump,

BRIEF DESCRIPTION OF THE DRAWING

FIG. 5 is a plan view of a heat transfer tube of the cooling unit illustrated in FIG. 3;

FIG. 6 is a front view of the heat transfer tube illustrated in FIG. 5;

FIG. 7 is a side view of the heat transfer tube illustrated FIG. 5;

FIG. 8 is an enlarged partially sectional view of the heat transfer tube illustrated in FIG. 5;

FIG. 9 is another enlarged partially sectional view of the heat transfer tube illustrated in FIG. 5;

DESCRIPTION OF THE PREFERRED EMBODIMENT

Figure 1:
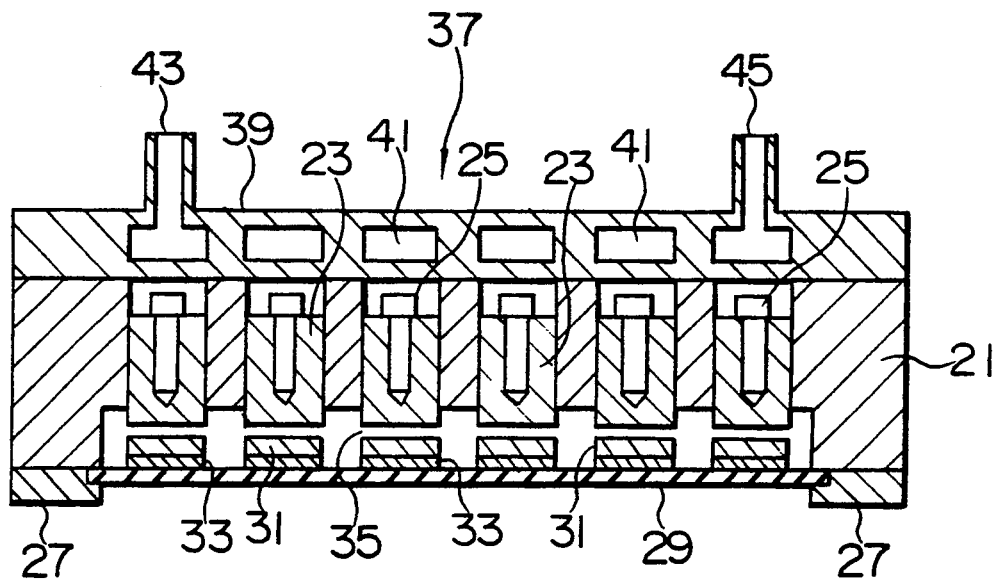
FIG. 1 is a sectional view of a conventional cooling unit.
Figure 2:
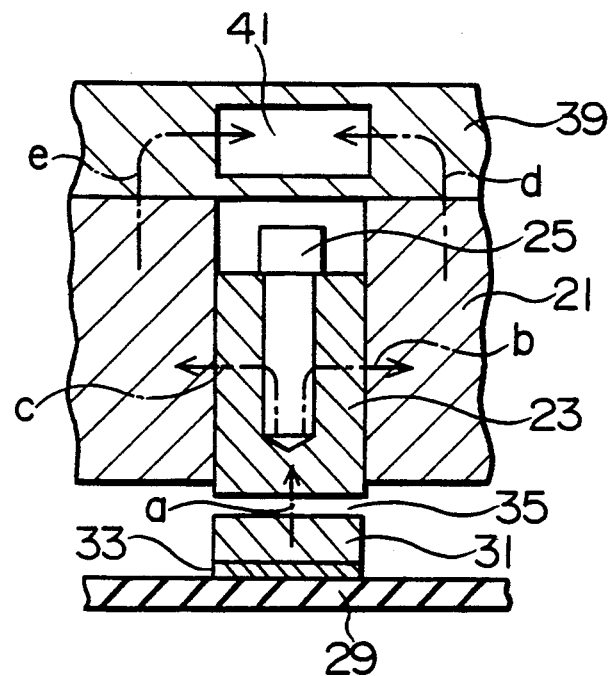
FIG. 2 is a partial sectional view of the conventional cooling unit illustrated in FIG. 1.

Referring to FIGS. 1 and 2, a conventional cooling unit will first be described for a better understanding of this invention. The conventional unit comprises a hat 21, a plurality of pistons 23, a plurality of screws 25, and a plurality of frames The pistons 23 are attached to the hat 21. The screws 25 fix the pistons 23 to the hat 21. The frames 27 are fixed to the hat 51. The frames 27 hold a substrate 29 on which a plurality of integrated circuit chips 31 are mounted by masses of solder 33, respectively. The screws 25 fix the pistons 23 to the hat 21 with a gap 35 between each of the pistons 23 and each of the integrated circuit chips 31.

The cooling unit is for use in combination with a cooling medium supplying unit 37. The cooling medium supplying unit 37 comprises a cooling plate 39 attached to the hat 21. The cooling plate 39 defines a main path 41 having a main inlet 43 and a main outlet 45. The main path 41 is for passing a cooling medium from the main inlet 43 to the main outlet 45.

Each of the integrated circuit chips 31 generates heat when the integrated circuit chips 31 are supplied with electric power. The heat from each of the integrated circuit chips 31 is supplied to the cooling medium in the main path 41 through the gap 35, the piston 23, the hat 21, and the cooling plate 39 in directions indicated by dash-dot lines a, b, c, d, and e with arrowheads (FIG. 2). As a result, the conventional cooling unit is incapable of speedily cooling the integrated circuit chips 31. Inasmuch as each of the pistons 23 is adjacent to each of the integrated circuit chips 31, the conventional cooling unit is incapable of easily attaching electric connectors to the integrated circuit chips.

Figure 3:
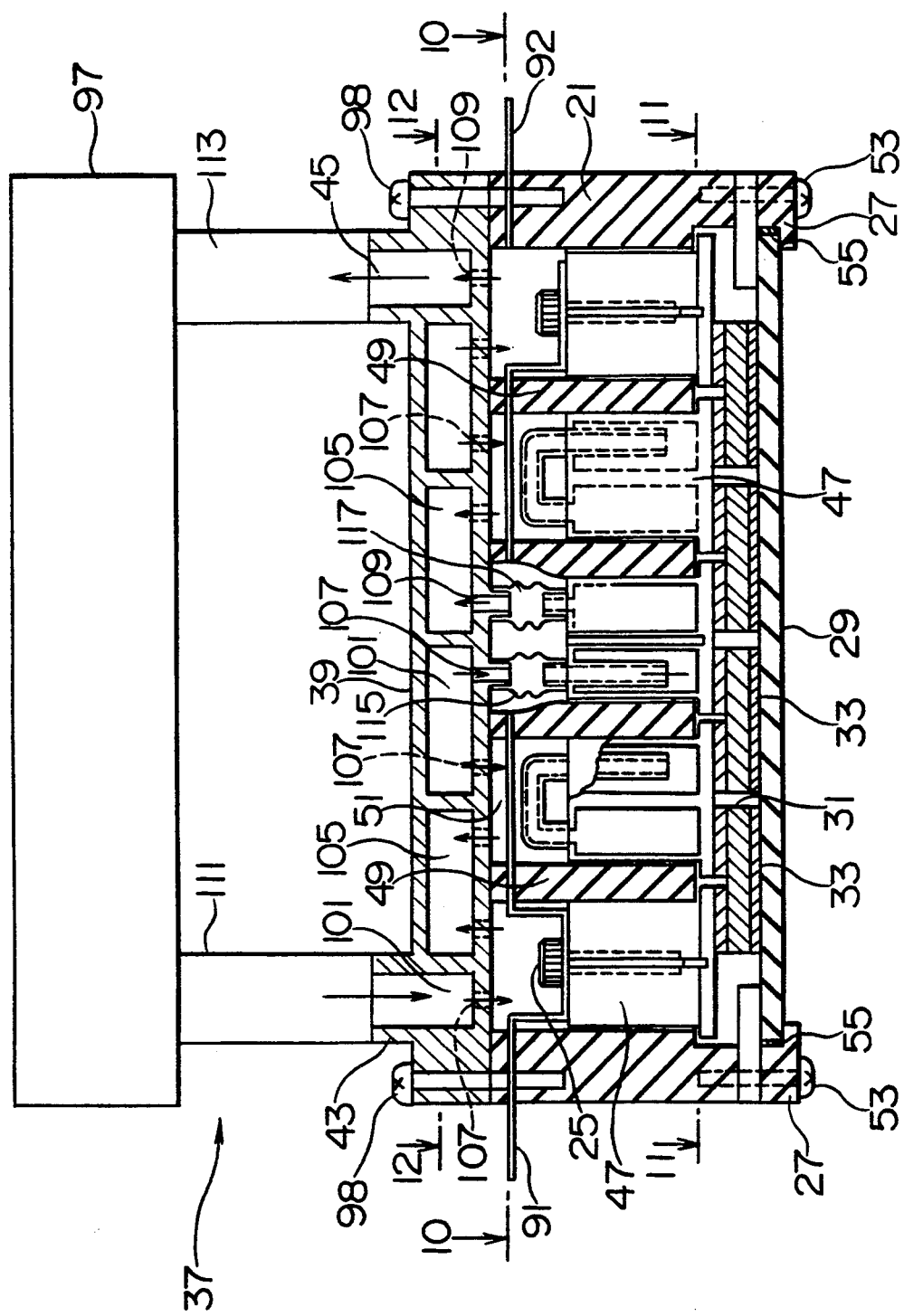
FIG. 3 is a sectional view of a cooling unit according to an embodiment of this invention.
Figure 4:
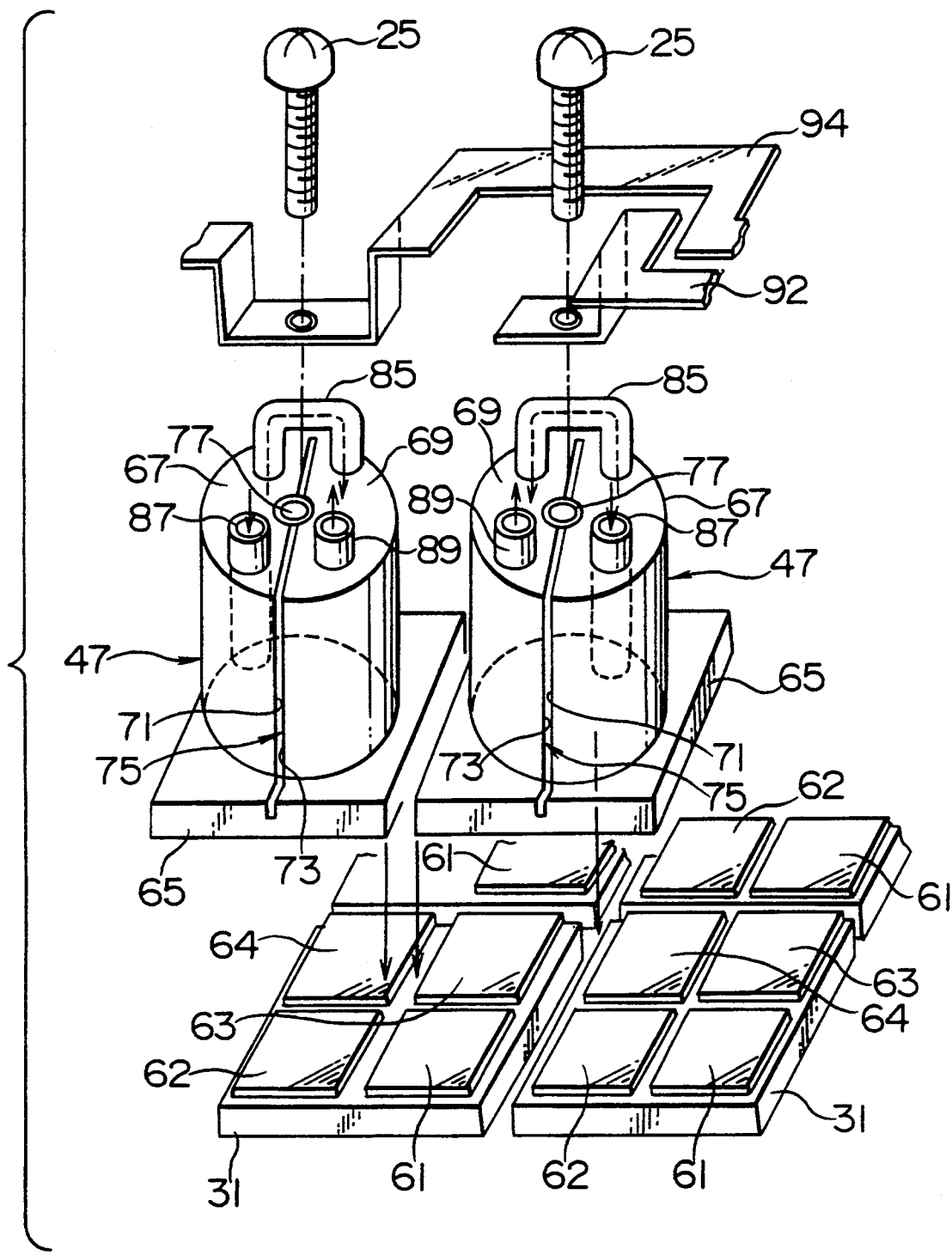
FIG. 4 is an exploded perspective view of main parts of the cooling unit illustrated in FIG. 3.

Referring to FIGS. 3 and 4, the description will proceed to a cooling unit according to a preferred embodiment of this invention. Similar parts are designated by like reference numerals.

In FIG. 3, the cooling unit comprises the hat the frames 27, a plurality of heat transfer tubes 47, and the screws 25. The hat 21 is made of an insulating material. The heat transfer tubes 47 are electrically conductive.

The hat 21 has a plurality of internal walls 49 which define installation spaces 51. Each of the heat transfer tubes 47 is positioned in each of the installation spaces 51. The frames 27 are fixed to the hat 21 by screws 53. The frames 27 hold the substrate 29 on which the integrated circuit chips 31 are mounted by masses of solder 33, respectively. The frames 27 are adhered to the substrate 29 by masses of an adhesive 55. First through fourth electric conductor bumps 61, 62, 63, and 64 (FIG. 4) are attached to a principal surface of each of the integrated circuit chaps Each of the heat trampler tubes 47 has a contact plate 65 at an end thereof. Each of the contact plates 65 is put in contact with the first electric conductor bump 61 of one of the adjacent four integrated circuit chips 31, the second electric conductor bump 62 of another of adjacent four integrated circuit chips 31, the third electric conductor bump 63 of still another of the adjacent four integrated circuit chips 31, and the fourth electric conductor bump 64 of yet another of the adjacent four integrated circuit chips 31.

Each of the heat transfer tubes 47 comprises a first semi-cylinder 67 and a second semi-cylinder 69 which forms a cylinder in cooperation. The first semi-cylinder 67 has a first opposite surface 71. The second semi-cylinder 69 has a second opposite surface 73 which is adjacent to the first opposite surface 71. The first and the second opposite surfaces 71 and 73 form a slit 75 and a tapped hole 77 which is positioned centrally of the first and the second opposite surface 71 and 73.

Referring to FIGS. 5, 6, 7, 8, and 9 with FIGS. 3 and 4 continuously referred to, it will be presumed that each of the screws 25 is driven into each of the tapped hole 77. In any event, a surface 79 of the screw in contact with the surfaces 71 and 73 of the tapped hole 77 so that a pressure 81 is generated (FIG. 9). Since the pressure 81 functions to widen the slit 77 of the heat transfer tube 47, an outer cylindrical surface 83 of the heat transfer tube 47 and the adjacent two internal walls 49 of the hat 21 (FIG. 3) are brought into tight contact, so that the heat transfer tube 47 is fixed to the hat 21 by friction.

Referring more particularly to FIG. 4, each of the heat transfer tubes 47 has a combination pipe 85 which combines the first and the second semi-cylinders 67 and 69. Each of the first semi-cylinders 67 has a tube inlet 87. Each of the second semi-cylinders 69 has a tube outlet 89.

Figure 10:
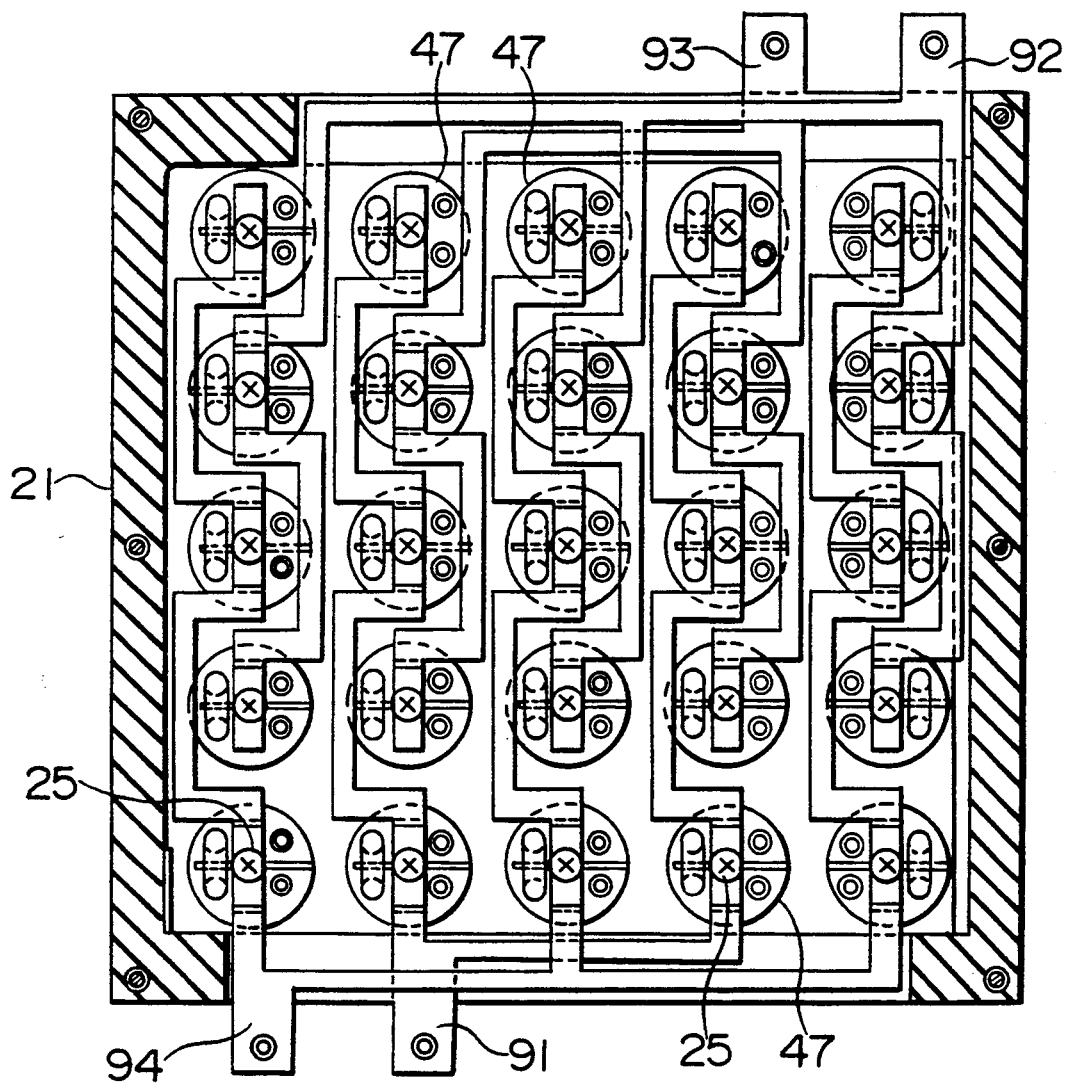
FIG. 10 is a schematic sectional view taken along a line 10—10 in FIG. 3.
Figure 11:
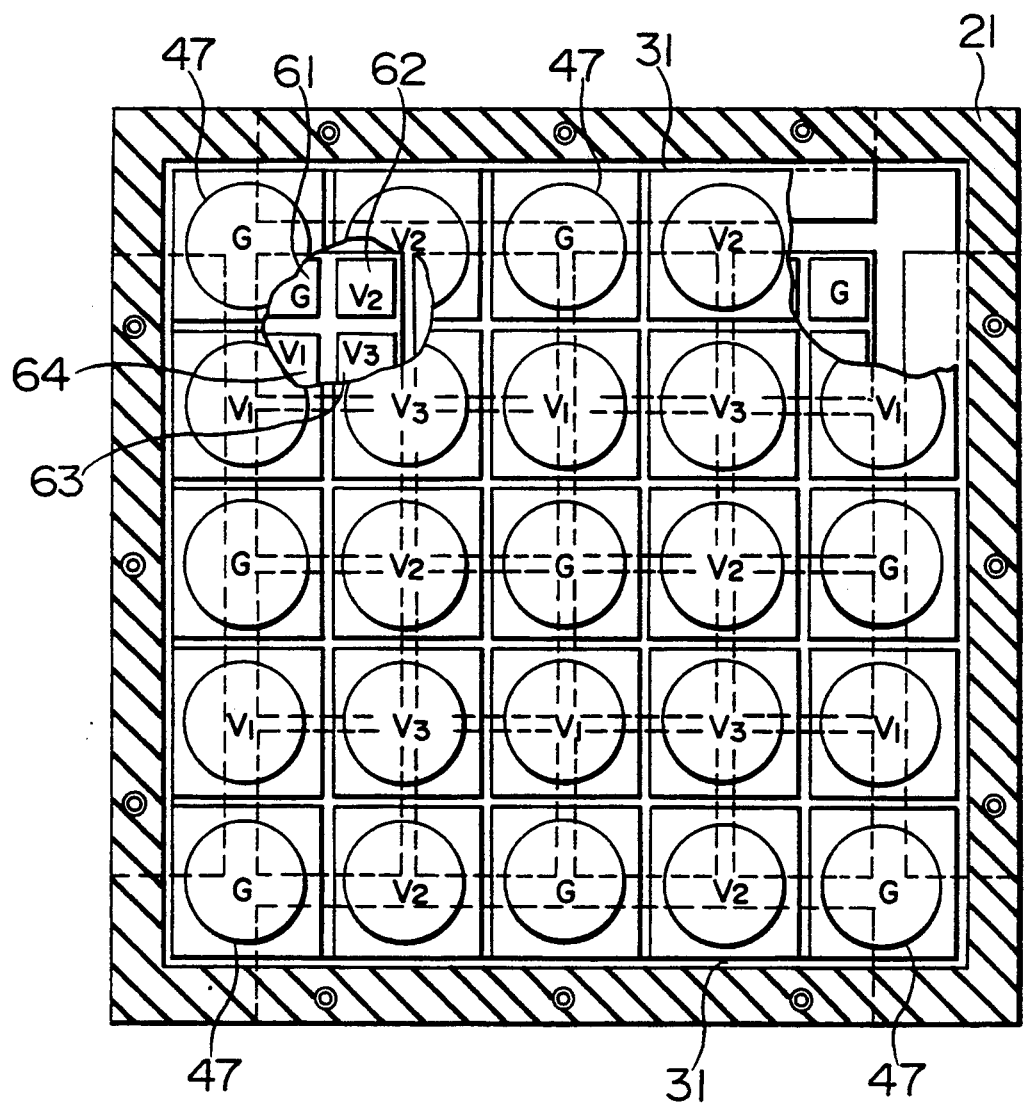
FIG. 11 is a schematic sectional view taken along a line 11—11 in FIG. 3.

Referring to FIGS. 10 and 11, each of the heat transfer tubes 47 is attached to a pertinent one of first through fourth connector strips 91, 92, 93, and 94. The first connector strip 91 is connected to a first power supply (not shown) and is supplied with a first voltage V1 from the first power supply. The second connector strip 92 is connected to a second power supply (not shown) and is supplied with a second voltage V2 from the second power supply. The third connector strip 93 is connected to a third power supply (not shown) and is supplied with a third voltage V3 from the third power supply. The fourth connector strip 94 is connected to a fourth power supply (not shown) is supplied with a fourth voltage G from the fourth power supply.

As a result, each of the heat transfer tubes 47 is supplied with a pertinent one of the first through the fourth voltages V1, V2, V3, and G are shown in FIG. 11. Consequently, each of the integrated circuit chips 31 is supplied with the first through the fourth voltages V1, V2, V3, and G from the first through the fourth power supplies through the first through the fourth connector strips 91, 92, 93, and 94, each of the heat transfer tubes 31, and the first through the fourth electric conductor bumps 61, 62, 63, and 64.

Figure 12:
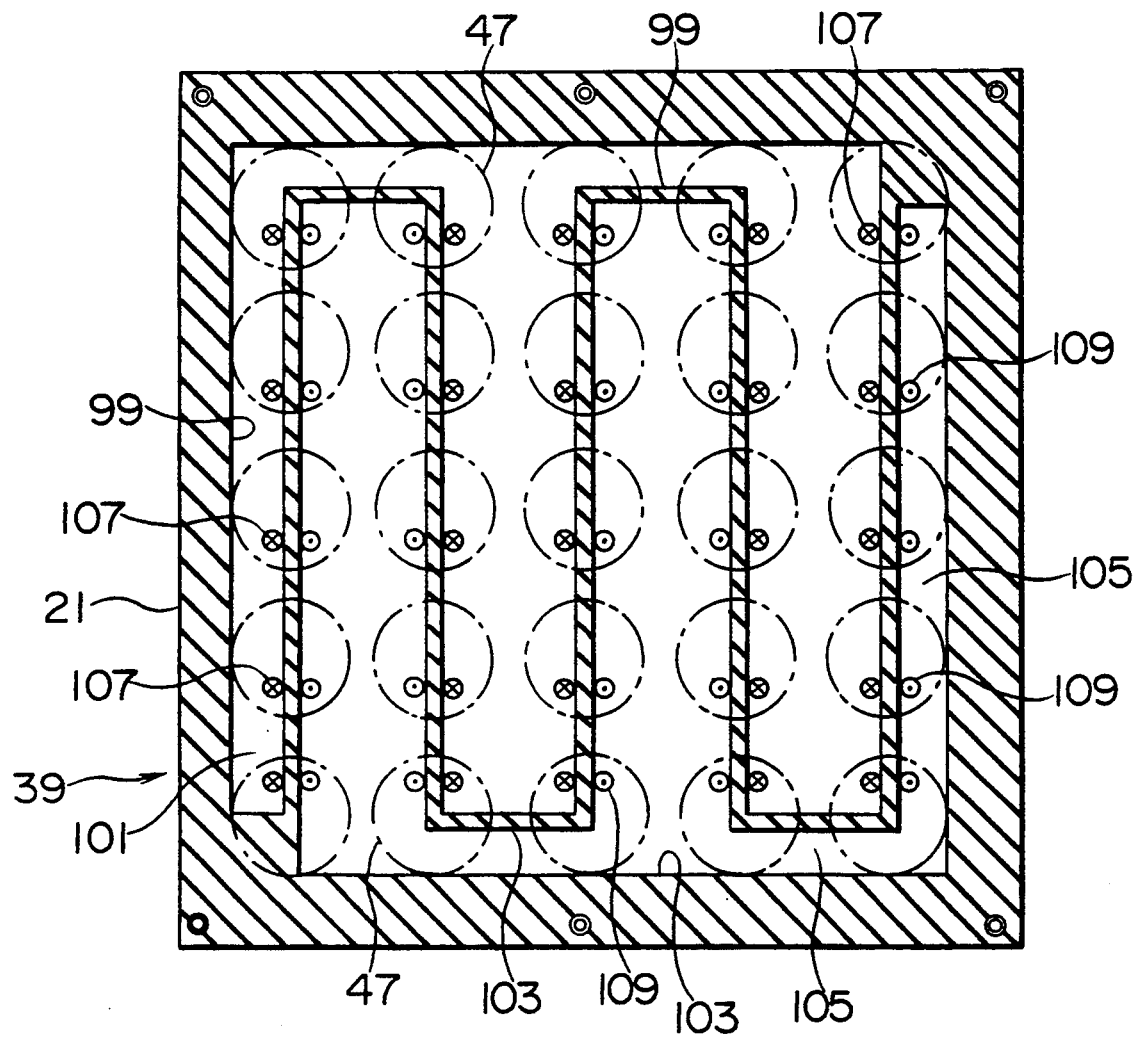
FIG. 12 is a schematic sectional view taken along a line 12—12 in FIG. 3.

Reviewing to FIG. 12 with FIG. 3 again referred to, the cooling medium supplying unit 37 comprises the cooling plate 39 and a cooling medium supplying device 97. The cooling plate 39 is fixed to the hat 21 by screws 98. The cooling medium supplying unit 37 is for using a cooling medium, for example, either water or "FLUORINERT" manufactured and sold by 3M.

The cooling plate 39 has a first main wall surface 99 defining a first main path 101 and a second main wall surface 103 defining a second main path 105. The first main path 101 has the main inlet 43 and a plurality of inlet perforations 107. The second main path 105 has the main outlet 45 and a plurality of outlet perforations 109. The cooling medium supplying device 97 is associated with the main inlet 43 and the main outlet 45 through a main inlet hose 111 and a main outlet hose 113, respectively. The cooling medium supplying device 97 supplies the cooling medium to the first main path 101 through the main inlet hose 111 and the main inlet 43. The cooling medium supplying device 97 is supplied with the cooling medium from the second main path 105 through the main outlet 45 and the main outlet hose 113.

Returning back to FIG. 3, each of the tube inlets 87 is associated with the first main path 101 through the inlet perforation 107 and a flexible inlet hose Each of the tube outlets M9 is associated with the second main path 105 through the outlet perforation 109 and a flexible outlet hose 117. Consequently, the first semi-cylinder 67 is supplied with the cooling medium from the first main path 101 through the inlet perforation 107, the flexible inlet hose 115, and the tube inlet 87. The second semi-cylinder 69 is supplied with the cooling medium from the first semi-cylinder 67 through the combination pipe 85. The second main path 105 is supplied with the cooling medium from the second semi-cylinder 69 through the tube outlet 109, the flexible outlet hose 117, and the outlet perforation 109.

Each of the integrated circuit chips 31 generates heat when each of the integrated circuit chips 31 is supplied with electric power. The heat from each of the integrated circuit chips 31 is supplied to the cooling medium in the heat transfer tubes 47.

When the cooling medium supplying unit 37 is for use with water as the cooling medium, insulator films are formed on internal surfaces of the heat transfer tubes 47.

What is claimed is:

1. A cooling unit for use in combination with a cooling medium supplying unit for supplying a cooling medium to said cooling unit, said cooling unit being for use with an integrated circuit chip mounted on a substrate, said integrated circuit chip having a first principal surface on which a first and a second electric conductor bump is attached, said cooling unit comprising:

a first heat transfer tube having a first tube inlet and a first tube outlet for passing said cooling medium from said first tube inlet to said first tube outlet, said first heat transfer tube being electrically conductive;

a second heat transfer tube having a second tube inlet and a second tube outlet for passing said cooling medium from said second tube inlet to said second tube outlet, said second heat transfer tube being electrically conductive; and tube supporting means for supporting said first heat transfer tube put in contact with said first electric conductor bump and said second heat transfer tube put in contact with said second electric conductor bump, said first electric conductor bump being for receiving a first voltage through said first heat transfer tube, said second electric conductor bump being for receiving a second voltage through said second heat transfer tube.

2. A cooling unit for use in combination with a cooling medium supplying unit for supplying a cooling medium to said cooling unit, said cooling unit being for use in a first and a second integrated circuit chip mounted on a substrate, said first integrated circuit chip having a first principal surface on which a primary first and a primary second electric conductor bump is attached, said second integrated circuit chip having a second principal surface on which a secondary first and a secondary second electric conductor bump is attached, said cooling unit comprising:

a first heat transfer tube having a first tube inlet and a first tube outlet for passing said cooling medium from said first tube inlet to said first tube outlet, said first transfer tube being electrically conductive;

a second heat transfer tube having a second tube inlet and a second tube outlet for passing said cooling medium from said second tube inlet to said second tube outlet, said second heat transfer tube being electrically conductive; and tube supporting means for supporting said first transfer tube put in contact with said primary first electric conductor bump and said secondary first electric conductor bump and said second transfer tube put in contact with said primary second electric conductor bump and said secondary second electric conductor bump, said primary first electric conductor bump and said secondary first electric conductor bump being for receiving a first voltage through said first heat transfer tube, and said primary second and secondary second electric conductor bumps being for receiving a second voltage through said second heat transfer tube.

* * * * *